(12) United States Patent
Bazarsky et al.

(10) Patent No.: US 11,501,109 B2
(45) Date of Patent: *Nov. 15, 2022

(54) NON-VOLATILE MEMORY DIE WITH ON-CHIP DATA AUGMENTATION COMPONENTS FOR USE WITH MACHINE LEARNING

(71) Applicant: Western Digital Technologies, Inc., San Jose, CA (US)

(72) Inventors: Alexander Bazarsky, Holon (IL); Ariel Navon, Revava (IL)

(73) Assignee: Western Digital Technologies, Inc., San Jose, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 16/447,619

(22) Filed: Jun. 20, 2019

(65) Prior Publication Data
US 2020/0401850 A1    Dec. 24, 2020

(51) Int. Cl.
*G06F 11/10*   (2006.01)
*G06K 9/62*    (2022.01)
(Continued)

(52) U.S. Cl.
CPC ........ *G06K 9/6257* (2013.01); *G06F 11/0727* (2013.01); *G06N 20/00* (2019.01);
(Continued)

(58) Field of Classification Search
CPC ....... G06K 9/6257; G06T 3/0006; G06T 3/60; G06N 20/00; G06F 11/0727; G11C 16/26
See application file for complete search history.

(56) References Cited

U.S. PATENT DOCUMENTS 6,545,907 B1   4/2003  Lowrey et al.
7,075,841 B2   7/2006  Resta et al.
(Continued)

FOREIGN PATENT DOCUMENTS

CN    106485317 A    3/2017
CN    107301455 A    10/2017
(Continued)

OTHER PUBLICATIONS

International Search Report and Written Opinion for International Application No. PCT/US19/68980, dated Mar. 23, 2020, 9 pages.
(Continued)

*Primary Examiner* — John W Lee
(74) *Attorney, Agent, or Firm* — Loza & Loza, LLP; Gabriel Fitch

(57) ABSTRACT

Methods and apparatus are disclosed for implementing machine learning data augmentation within the die of a non-volatile memory (NVM) apparatus using on-chip circuit components formed on or within the die. Some particular aspects relate to configuring under-the-array or next-to-the-array components of the die to generate augmented versions of images for use in training a Deep Learning Accelerator of an image recognition system by rotating, translating, skewing, cropping, etc., a set of initial training images obtained from a host device. Other aspects relate to configuring under-the-array or next-to-the-array components of the die to generate noise-augmented images by, for example, storing and then reading training images from worn regions of a NAND array to inject noise into the images.

18 Claims, 14 Drawing Sheets

(51) Int. Cl.
*G06V 10/82* (2022.01)
*G06V 10/94* (2022.01)
*G06N 3/08* (2006.01)
*G11C 16/04* (2006.01)
*G06T 3/00* (2006.01)
*G06N 20/00* (2019.01)
*G06F 11/07* (2006.01)
*G11C 16/26* (2006.01)
*G06T 3/60* (2006.01)

(52) U.S. Cl.
CPC .............. *G06T 3/0006* (2013.01); *G06T 3/60* (2013.01); *G11C 16/26* (2013.01)

(56) References Cited

U.S. PATENT DOCUMENTS

| | | |
|---|---|---|
| 7,274,586 B2 | 9/2007 | Choi et al. |
| 7,983,069 B2 | 7/2011 | Hsu et al. |
| 7,990,642 B2 | 8/2011 | Lee et al. |
| 8,199,566 B1 | 6/2012 | Fackenthal et al. |
| 8,725,935 B2 | 5/2014 | Huang et al. |
| 8,793,554 B2 | 7/2014 | Billing et al. |
| 9,530,491 B1 | 12/2016 | Uttarwar et al. |
| 9,646,243 B1 | 5/2017 | Gokmen |
| 9,767,565 B2 | 9/2017 | Estrada et al. |
| 9,880,760 B2 | 1/2018 | Inbar et al. |
| 10,176,092 B2 | 1/2019 | Alcantara et al. |
| 2010/0027329 A1 | 2/2010 | Lee et al. |
| 2012/0311262 A1 | 12/2012 | Franceschini et al. |
| 2013/0013860 A1 | 1/2013 | Franceschini et al. |
| 2016/0026912 A1 | 1/2016 | Falcon et al. |
| 2016/0064409 A1 | 3/2016 | Yaegashi |
| 2016/0085464 A1 | 3/2016 | Tuers et al. |
| 2016/0092129 A1 | 3/2016 | Agarwal et al. |
| 2016/0345009 A1* | 11/2016 | Zhong .................... H04N 19/44 |
| 2017/0068451 A1 | 3/2017 | Kenan et al. |
| 2017/0200078 A1 | 7/2017 | Bichler |
| 2017/0270403 A1 | 9/2017 | Zhang |
| 2017/0337466 A1 | 11/2017 | Bayat et al. |
| 2018/0052766 A1 | 2/2018 | Mehra et al. |
| 2018/0075338 A1 | 3/2018 | Gokmen |
| 2018/0075344 A1 | 3/2018 | Ma et al. |
| 2018/0157934 A1* | 6/2018 | Hu ........................ G06K 9/6262 |
| 2018/0232508 A1 | 8/2018 | Kursun |
| 2018/0330238 A1 | 11/2018 | Luciw et al. |
| 2019/0019564 A1 | 1/2019 | Li et al. |
| 2019/0057302 A1* | 2/2019 | Cho ...................... G06F 12/063 |
| 2019/0129834 A1* | 5/2019 | Purkayastha ........ G06F 12/0246 |
| 2019/0147320 A1* | 5/2019 | Mattyus ............... G06V 20/182 382/155 |
| 2019/0156202 A1 | 5/2019 | Falk et al. |
| 2019/0189236 A1* | 6/2019 | Poliakov .................. G06N 3/04 |
| 2019/0243787 A1 | 8/2019 | Mittal et al. |
| 2019/0258920 A1 | 8/2019 | Lie et al. |
| 2020/0004674 A1* | 1/2020 | Williams ............... G06N 20/00 |
| 2020/0311523 A1 | 10/2020 | Hoang et al. |
| 2020/0388071 A1* | 12/2020 | Grabner .................. G06T 17/00 |
| 2020/0401344 A1* | 12/2020 | Bazarsky ............... G06N 20/00 |

FOREIGN PATENT DOCUMENTS

| | | |
|---|---|---|
| CN | 108985344 A | 12/2018 |
| KR | 20180028966 A | 3/2018 |
| KR | 20180116094 A | 10/2018 |

OTHER PUBLICATIONS

Wang et al. "The Effectiveness of Data Augmentation in Image Classification using Deep Learning"; Dec. 13, 2017 <http://cs231n.stanford.edu/reports/2017/pdfs/300.pdf> 8 pages.

"NGD Systems: Introduction to Computational Storage;" NGD Systems, Inc; Jun. 2018 <www.ngdsystems.com> 5 pages.

Mikolajczyk et al. "Data Augmentation for Improving Deep Learning in Image Classification Problem;" 2018 International Interdisciplinary PhD Workshop (IIPhDW); May 2018; DOI: 10.1109/IIPHDW.2018.8388338; <https://ieeexplore.ieee.org/document/8388338> 6 pages.

Chi et al., "Prime: A Novel Processing-in-memory Architecture for Neural Network Computation in ReRAM-based Main Memory," 2016 ACM SIGARCH Computer Architecture News Jun. 1, 20168 (vol. 44, No. 3, pp. 27-39). IEEE Press. <https://seal.ece.ucsb.edu/sites/seal.ece.ucsb.edu/files/publications/prime_isca_2016.pdf>.

Choe et al., "Near-Data Processing for Machine Learning," 2017, International Conference on Learning Representations. 12 pages. <https://openreview.net/pdf?id=H1_EDpogx>.

Sullivan, John, "Merging Memory and Computation, Programmable Chip Speeds AI, Slashes Power Use," Nov. 15, 2018, 5 pages <https://m.techxplore.com/news/2018-11-merging-memory-programmable-chip-ai.html>.

Jia et al., "A Microprocessor Implemented in 65nm CMOS with Configurable and Bit-scalable Accelerator for Programmable In-memory Computing," Nov. 9, 2018, 10 pages <https://arxiv.org/pdf/1811.04047.pdf>.

Valavi et al., "A Mixed-Signal Binarized Convolutional-Neural-Network Accelerator Integrating Dense Weight Storage and Multiplication for Reduced Data Movement," VLSI Symp. on Circuits (VLSIC), Jun. 2018. 2 pages. <http://www.princeton.edu/~nverma/VermaLabSite/Publications/2018/ValaviRamadgeNestlerVerma_VLSI18.pdf>.

Nielsen, Michael, "Neural Networks and Deep Learning, Chapter 2: How the backpropagation algorithm works," 2015, 27 pages <http://neuralnetworksanddeeplearning.com/chap2.html>.

Poznanski et al., "CNN-N-Gram for Handwriting Word Recognition," Dec. 12, 2016; pp. 2305-2314. <https://www.cs.tau.ac.il/~wolf/papers/CNNNGram.pdf>.

Inoue, Hiroshi, "Data Augmentation by Pairing Samples for Images Classification," Apr. 11, 2018. 8 pages. <https://arxiv.org/pdf/1801.02929.pdf>.

Hadidi et al., "Demystifying the Characteristics of 3D-Stacked Memories: A Case Study for Hybrid Memory Cube", Oct. 3, 2017 IEEE. 978-1-5386-1233-017. 10 pages. <https://arxiv.org/pdf/1706.02725>.

Park et al., "A hybrid flash translation layer design for SLC-MLC flash memory based multibank solid state disk", Microprocessors and Microsystems vol. 35, Issue 1, Feb. 2011, pp. 48-59 <https://www.sciencedirect.com/science/article/abs/pii/S0141933110000475>.

International Search Report and Written Opinion for International Application No. PCT/US2019/050105, dated Nov. 3, 2020, 13 pages.

Huang et al., "LTNN: An Energy-efficient Machine Learning Accelerator on 3D CMOS-RRAM for Layer-wise Tensorized Neural Network", 2017 30th IEEE International System-on-Chip Conference (SOCC); Sep. 5-8, 2017; 6 pages <https://ieeexplore.ieee.org/document/8226058>.

* cited by examiner

NON-VOLATILE MEMORY DIE WITH ON-CHIP DATA AUGMENTATION COMPONENTS FOR USE WITH MACHINE LEARNING

FIELD

The disclosure relates, in some embodiments, to non-volatile memory (NVM) dies. More specifically, but not exclusively, the disclosure relates to methods and apparatus for implementing data augmentation within an NVM die for use with machine learning.

INTRODUCTION

Machine learning generally relates to the use of artificial intelligence to perform tasks without explicit instructions and instead relying on patterns and inference. Deep learning (which also may be referred to as deep structured learning or hierarchical learning) relates to machine learning methods based on learning data representations or architectures, such as deep neural networks (DNNs), rather than to task-specific procedures or algorithms. Deep learning is applied to such fields as speech recognition, computer vision, and self-driving vehicles. Deep learning may be accomplished by, or facilitated by, deep learning accelerators (DLAs), e.g., microprocessor devices designed to accelerate the generation of useful neural networks to implement deep learning.

A DLA or other machine learning system may need to be trained using initial training data, such as an initial set of images that have been tagged or labeled for use in training an image recognition system. Data augmentation includes procedures for expanding an initial set of images in a realistic but randomized manner to increase the variety of data for use during training. For example, a small set of input images may be altered slightly (by, e.g., rotating or skewing the images) to create a larger set of images (i.e. an augmented image set) for use in training the system. That is, data augmentation allows re-using tagged or labeled data in multiple training instances in order to increase the size of the training data set.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

One embodiment of the disclosure provides an apparatus that includes: a die with non-volatile memory (NVM) elements; and a data augmentation controller formed in the die and configured to augment machine learning data stored within the NVM elements with augmented machine learning data.

Another embodiment of the disclosure provides a method for use with a die having an NVM array, the method including: storing machine learning data within the NVM array of the die; and generating augmented machine learning data using data augmentation circuitry formed in the die.

Yet another embodiment of the disclosure provides an apparatus with a die having an NVM array where the apparatus includes: means formed in the die for storing a machine learning data within the NVM array of the die; and means formed in the die for generating at least one augmented version of the machine learning data.

DETAILED DESCRIPTION

Figure 1:
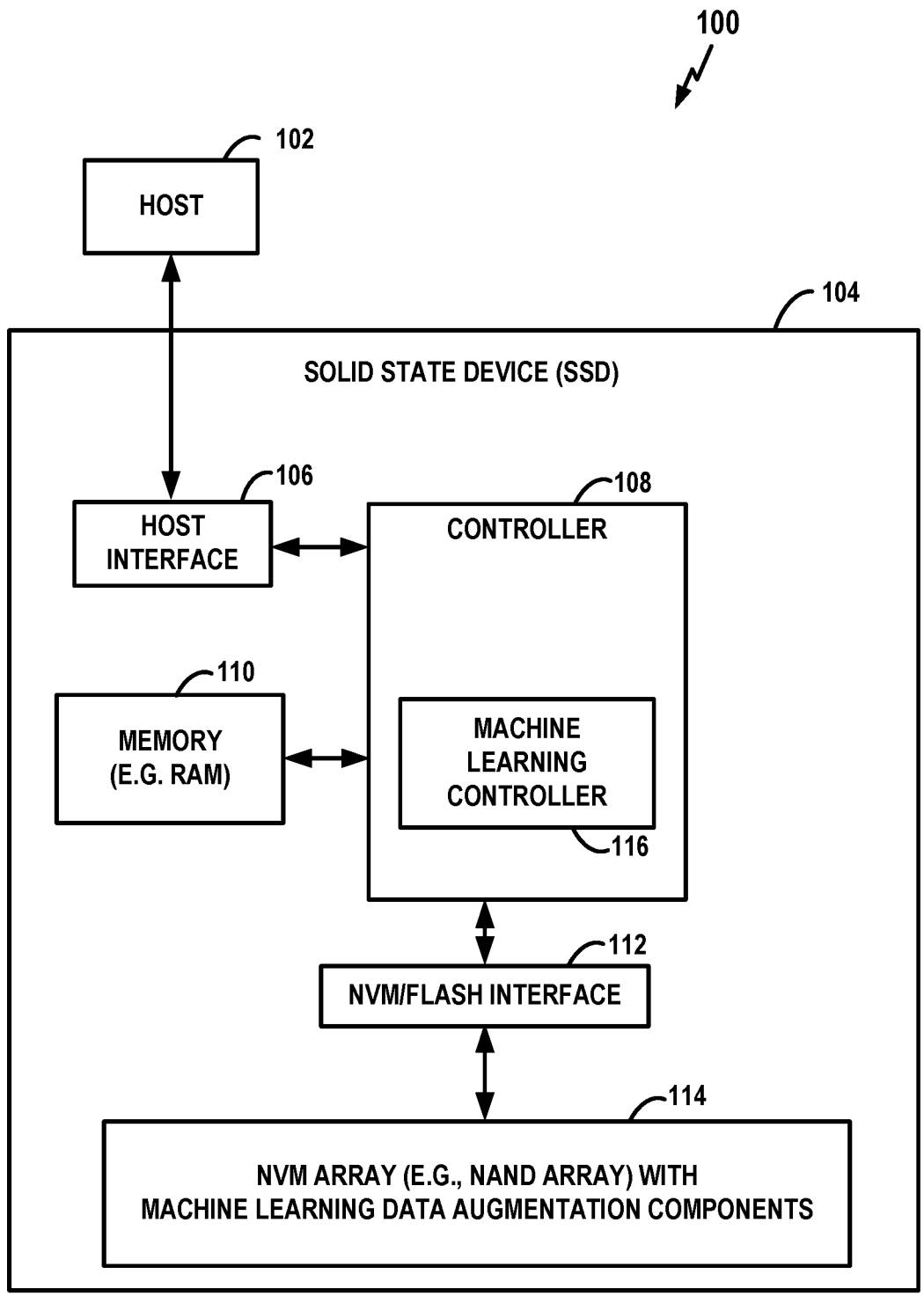
FIG. 1 illustrates a schematic block diagram configuration for an exemplary solid state device (SSD) having one or more non-volatile memory (NVM) array dies, where the dies have on-chip data augmentation components.

In the following detailed description, reference is made to the accompanying drawings, which form a part thereof. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

The examples herein relate to non-volatile memory (NVM) arrays, and to data storage devices or apparatus for controlling the NVM arrays, such as a controller of a data storage device (such as an SSD), and in particular to NAND flash memory storage devices (herein "NANDs"). (A NAND is a type of non-volatile storage technology that does not require power to retain data. It exploits negative-AND, i.e. NAND, logic.) For the sake of brevity, an SSD having one or more NAND dies will be used below in the description of various embodiments. It is understood that at least some aspects described herein may be applicable to other forms of data storage devices as well. For example, at least some aspects described herein may be applicable to phase-change memory (PCM) arrays, magneto-resistive random access memory (MRAM) arrays and resistive random access memory (ReRAM) arrays. In addition, the various embodiments may be used in various machine learning devices which may include some combination of processing elements and memory/data storage elements, including the NVM arrays constructed/configured in accordance with the described embodiments.

Overview

As noted above, machine learning may be accomplished by, or facilitated by, deep learning accelerators (DLAs), e.g., microprocessor devices designed to accelerate the generation of deep neural networks (DNNs) to implement machine learning. These neural networks may also be referred to as learning networks. A DLA may need to be trained using initial training data, such as an initial set of images for training an image recognition system having a DLA. Data augmentation is a process of modifying an initial set of images (in, e.g., a realistic but randomized manner) to increase the variety or variance of data for use during training. For example, a set of input images may be altered (by, e.g., rotating or skewing the images) to create a larger set of images (an augmented image set) for use in training the system. Data augmentation may be defined more generally as a regularization technique for avoiding overfitting when training a machine learning system, such as a machine learning network or algorithm. Regularization is the process of adding information in order to solve an ill-posed problem or to prevent overfitting during machine learning. For example, regularization may make slight modifications to a learning model so the learning model generalizes more effectively from training data. Herein, the term data augmentation is defined as generating at least one modified version of data to avoid or reduce the risk of overfitting during training of a machine learning system using the data. The data may be, for example, a data vector, data array, data object or data representation of any number of dimensions, such as a 2-D data object containing one or more patterns. Examples of such data include images or audio segments or other types of numerical data, categorical data, time series data, or text.

Deep learning or machine learning may be implemented using processing components that are integrated with the memory components where the data to be processed is stored, i.e. using "near memory" computing, so as to reduce the need to transfer large quantities of data from one component to another. (The alternative, i.e. using standalone processing units such as graphics processing units (GPUs), central processing units (CPUs), etc., and stand-alone memory units such as dynamic random-access-memory (DRAM), can require transference of large quantities of data from one component to another.)

Herein, methods and apparatus are disclosed for implementing data augmentation for use with near memory machine learning systems such as DNNs employing DLAs where the data augmentation is performed within the die of an NVM using, for example, under-the-array data augmentation components or next-to-the-array components or is performed using components of an off-chip memory controller coupled to the die. That is, a near memory computing architecture is disclosed herein for data augmentation.

Note that a DNN is an example of an artificial neural network that has multiple layers between input and output layers. A DNN operates to determine a mathematical computation or manipulation to convert the input into the output, which might be a linear or non-linear computation. For example, the DNN may work through its layers by calculating a probability of each output. Each mathematical manipulation may be considered a layer. Networks that have many layers are referred to as having "deep" layers, hence the term DNN. In one particular example, the DNN might be configured to identify a person within an input image by processing the bits of the input image to yield identify the particular person, i.e. the output of the DNN is a value that identifies the particular person. The DNN may need to be trained. The data augmentation procedures and apparatus described herein may be used to augment an initial set of training data, such as an initial set of labeled images (where labeled images are images containing known data, such as an image that has already been identified as corresponding to a particular type of object). In addition to configuring an NVM die for near memory data augmentation, the die may also be configured for near memory DNN processing by, for example, providing a DLA on the die as well as data augmentation circuits.

An advantage of at least some of the exemplary methods and apparatus described herein is that only the final result of a data augmented training procedure is transferred to the controller and host, thus avoiding the transference of large amounts of training data, such as augmented sets of training images that might include thousands of augmented images.

Note also that the data augmentation machine learning dies described herein may be different from GPUs in that a GPU typically transfers calculated data from its NVM to a volatile RAM/DRAM, whereas the augmentations described in various examples herein are done by the NAND dies. As noted, in some examples, the die includes extra-array logic for performing the augmentation, storing the results, and performing other machine learning operations, such as the actual training of a DLA based on the augmented data. Thus, in some aspects, a NVM architecture is disclosed that offloads data augmentation from host devices or other devices and instead performs the augmentation within the NVM die. Moreover, at least some of the methods and apparatus disclosed herein exploit die parallelism and inherent features of an NVM (such as inherent noise features). This can facilitate the implementation of machine learning edge computing application training on-chip.

The data augmentation methods and apparatus described herein may be used in conjunction with on-chip DLA features and other features described in U.S. patent application Ser. No. 16/212,586 and in U.S. patent application Ser. No. 16/212,596, both entitled "NON-VOLATILE MEMORY DIE WITH DEEP LEARNING NEURAL NETWORK," and both filed Dec. 6, 2018, both of which are assigned to the assignee of the present application.

Exemplary Machine Learning Systems and Procedures

FIG. 1 is a block diagram of a system 100 including an exemplary SSD having an NVM with on-chip machine learning data augmentation components. The system 100 includes a host 102 and a SSD 104 coupled to the host 102. The host 102 provides commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, a workstation, a server, a personal digital assistant, a digital camera, or a digital phone as merely a few examples. Additionally or alternatively, the host 102 may be a system or device having a need for neural network processing, such as speech recognition, computer vision, and self-driving vehicles. For example, the host 102 may be a component of a self-driving system of a vehicle.

The SSD 104 includes a host interface 106, a controller 108, a memory 110 (such as RAM), an NVM interface 112 (which may be referred to as a flash interface), and an NVM 114, such as one or more NAND dies configured with on-chip machine learning data augmentation components. The host interface 106 is coupled to the controller 108 and facilitates communication between the host 102 and the controller 108. The controller 108 is coupled to the memory 110 as well as to the NVM 114 via the NVM interface 112. The host interface 106 may be any suitable communication interface, such as an Integrated Drive Electronics (IDE) interface, a Universal Serial Bus (USB) interface, a Serial Peripheral (SP) interface, an Advanced Technology Attachment (ATA) or Serial Advanced Technology Attachment (SATA) interface, a Small Computer System Interface (SCSI), an IEEE 1394 (Firewire) interface, or the like. In some embodiments, the host 102 includes the SSD 104. In other embodiments, the SSD 104 is remote from the host 102 or is contained in a remote computing system communicatively coupled with the host 102. For example, the host 102 may communicate with the SSD 104 through a wireless communication link.

The controller 108 controls operation of the SSD 104. In various aspects, the controller 108 receives commands from the host 102 through the host interface 106 and performs the commands to transfer data between the host 102 and the NVM 114. Furthermore, the controller 108 may manage reading from and writing to memory 110 for performing the various functions effected by the controller and to maintain and manage cached information stored in memory 110.

The controller 108 may include any type of processing device, such as a microprocessor, a microcontroller, an embedded controller, a logic circuit, software, firmware, or the like, for controlling operation of the SSD 104. In some aspects, some or all of the functions described herein as being performed by the controller 108 may instead be performed by another element of the SSD 104. For example, the SSD 104 may include a microprocessor, a microcontroller, an embedded controller, a logic circuit, software, firmware, or any kind of processing device, for performing one or more of the functions described herein as being performed by the controller 108. According to other aspects, one or more of the functions described herein as being performed by the controller 108 are instead performed by the host 102. In still further aspects, some or all of the functions described herein as being performed by the controller 108 may instead be performed by another element such as a controller in a hybrid drive including both non-volatile memory elements and magnetic storage elements.

The memory 110 may be any suitable memory, computing device, or system capable of storing data. For example, the memory 110 may be ordinary RAM, DRAM, double data rate (DDR) RAM (DRAM), static RAM (SRAM), synchronous dynamic RAM (SDRAM), a flash storage, an erasable programmable read-only-memory (EPROM), an electrically erasable programmable ROM (EEPROM), or the like. In various embodiments, the controller 108 uses the memory 110, or a portion thereof, to store data during the transfer of data between the host 102 and the NVM 114. For example, the memory 110 or a portion of the memory 110 may be a cache memory. The NVM 114 receives data from the controller 108 via the NVM interface 112 and stores the data. The NVM 114 may be any suitable type of non-volatile memory, such as a NAND-type flash memory or the like.

In the example of FIG. 1, the controller 108 may include hardware, firmware, software, or any combinations thereof that provide a machine learning controller 116 for use with the NVM array 114 (where the machine learning controller, in some examples, may include at least some off-chip data augmentation components such as components that control data augmentation based on controlling off-chip error correction). Although FIG. 1 shows an example SSD and an SSD is generally used as an illustrative example in the description throughout, the various disclosed embodiments are not necessarily limited to an SSD application/implementation. As an example, the disclosed NVM die and associated processing components can be implemented as part of a package that includes other processing circuitry and/or components. For example, a processor may include, or otherwise be coupled with, embedded NVM and associated circuitry and/or components for machine learning that are described herein. The processor could, as one example, off-load certain machine learning tasks to the NVM and associated circuitry and/or components. As another example, the controller 108 may be a controller in another type of device and still include the neural network controller 116 and perform some or all of the functions described herein.

Figure 2:
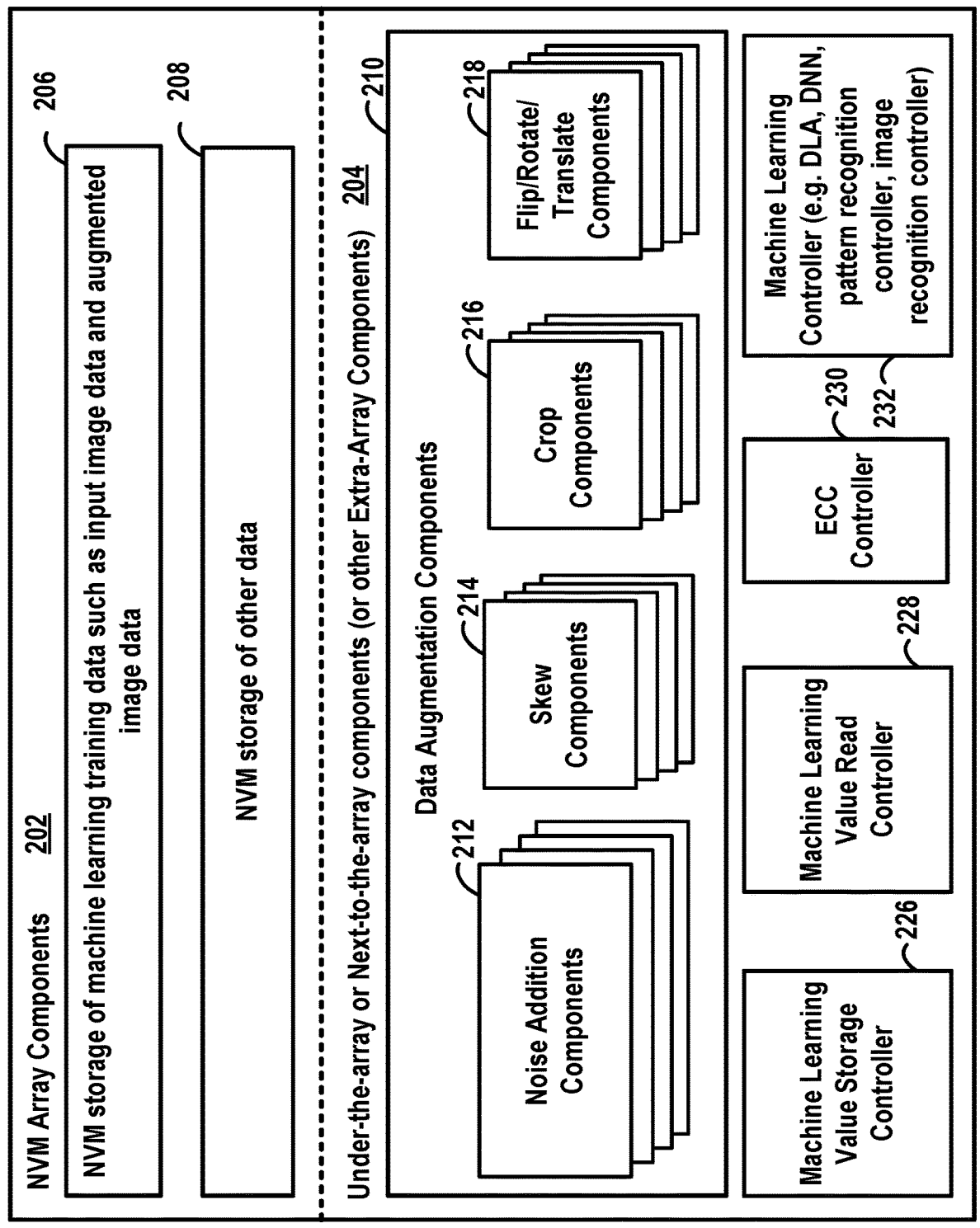
FIG. 2 illustrates an example of an NVM die having on-chip under-the-array or next-to-the-array components configured for data augmentation processing.

FIG. 2 illustrates a block diagram of an exemplary NVM die 200 that includes NVM storage array components 202 and under-the-array or next-to-the-array (or other extra-array) processing components 204. Not all circuit or memory components that might be used in a practical NVM die are illustrated in the figure, such as input and output components, voltage regulation components, clocks and timing components, etc. Rather only some components and circuits are shown, summarized as block or schematic diagrams. The exemplary NVM array components 202 include: NVM storage 206 for storing machine learning training data such as input image data and augmented image data; and NVM storage 208 configured for storing other data such as DNN synaptic weights, bias values, etc., or other types of user data or system data.

The NVM extra-array processing components 204 include data augmentation components 210 configured to perform or control data augmentation operations. In the example of FIG. 2, the exemplary data augmentation components 210 include: one or more noise addition components 212 configured to generate augmented machine learning data by adding noise to initial machine learning data, such as by adding uncorrelated noise to each of an initial set of labeled training images; one or more skew components 214 configured to generate augmented machine learning data by skewing initial machine learning data, such as by skewing each of an initial set of labeled training images in a different manner; one or more crop components 216 configured to generate augmented machine learning data by cropping initial machine learning data, such as by cropping each of an initial set of labeled training images in a different manner; one or more flip/rotate/translate components 218 configured to generate augmented machine learning data by flipping, rotating and/or translating initial machine learning data, such as by flipping, rotating and/or translating each of an initial set of labeled training images in a different manner.

Multiple instances of each augmentation component (212, 214, 216, and 218) are shown since, in some examples, a plurality of such devices may operate in parallel. For example, N noise addition components 212 may be provided to concurrently process N different input training images to generate a set of augmented images from each of the N different input training images. In other examples, only a single instance of each component may be provided. In still other examples, only one or a few of the illustrated components are provided such as only the noise addition components 212 or only the skew components 214. In yet other examples, other augmentation components are additionally or alternatively provided, which serve to augment the initial data set in other manners. Note also that the exemplary components of FIG. 2 primarily relate to the augmentation of image data. For examples where the data is not image data but, for example, audio data, different augmentation components may be provided that are appropriate to the type of data.

The NVM extra-array processing components 204 of FIG. 2 also include various other components including: a machine learning value storage controller 226 configured to store machine learning data in the NVM storage 206; a machine learning value read controller 228 configured to read previously-stored machine learning data from the NVM storage 206; and an on-chip error correction code (ECC) controller 230 configured to control any on-chip ECC applied to data as it is read from the NVM array components 202 to address a bit error rate (BER). As will be explained, certain types of data augmentation can be performed by adjusting ECC or, in some cases, deactivating ECC so as to increase the BER to selectively add noise into images. That is, a data augmentation controller may be configured to generate augmented data by reducing an amount of error correction performed by the error correction components compared to an average amount of error correction that would otherwise be employed to read data not subject to data augmentation, and then reading stored data from the NVM elements with the reduced error correction. And so, in one example, if the device ordinarily examines three bytes of ECC data within 512 bytes of data, ECC may be reduced by examining only two bytes of the ECC data. Thus, if the die itself is equipped for performing ECC procedures, those procedures can be deactivated or modified to increase the noise in the data read from the NAND arrays to provide augmented image data. It is noted that, in many systems, ECC is instead performed by a device controller that is separate from the die (such as controller 108 of FIG. 1). In such implementations, the die itself does not control ECC and hence cannot directly adjust the ECC. In such systems, because the ECC is performed by the controller, all images read by the die may be "noisy" images suitable for use as augmented images in on-chip training. Also, note that the BER for an NVM block may vary as a function of underlying conditions and memory type and so read controller 228 may be programmed or configured to take such information into account when selecting a target location for storing data. For example, for data augmentation purposes, write parameters may be selected or modified to increase the BER so that any augmentation requirements are satisfied. This is in contrast to the conventional desire to reduce BER so that ECC decoding is easier. As will be explained below, one technique for modifying write parameters is to modify the location where image data is written so as to store the data in worn regions of the NVM array 202 to thereby increase storage errors, so as to inject noise into the stored/retrieved image data.

FIG. 2 also illustrates a machine learning controller 232, which may be, e.g., a DLA, DNN, pattern recognition controller, image recognition controller, etc., configured to perform some form of machine learning using augmented data. In some examples, the augmented data is stored in the NVM arrays 202 for later use. In other examples, augmented data is held in other memory within the die, such as within data latches (not shown in FIG. 2), for immediate use by training components, then erased or overwritten. That is, in some examples, the augmented data may be transient data that is saved only as long as it is needed to train a machine learning system (e.g. a DNN) and then discarded.

In the following, various exemplary data augmentation systems and procedures are described where data is stored in a NAND array and where the data augmentation is used to train image or pattern recognition systems. As already explained, other types of NVM arrays may be used and the data augmentation may be applied to other types of machine learning. Hence, the following descriptions provide illustrative and non-limiting examples.

Image Recognition Examples Employing NVM-Based Data Augmentation

Figure 3:
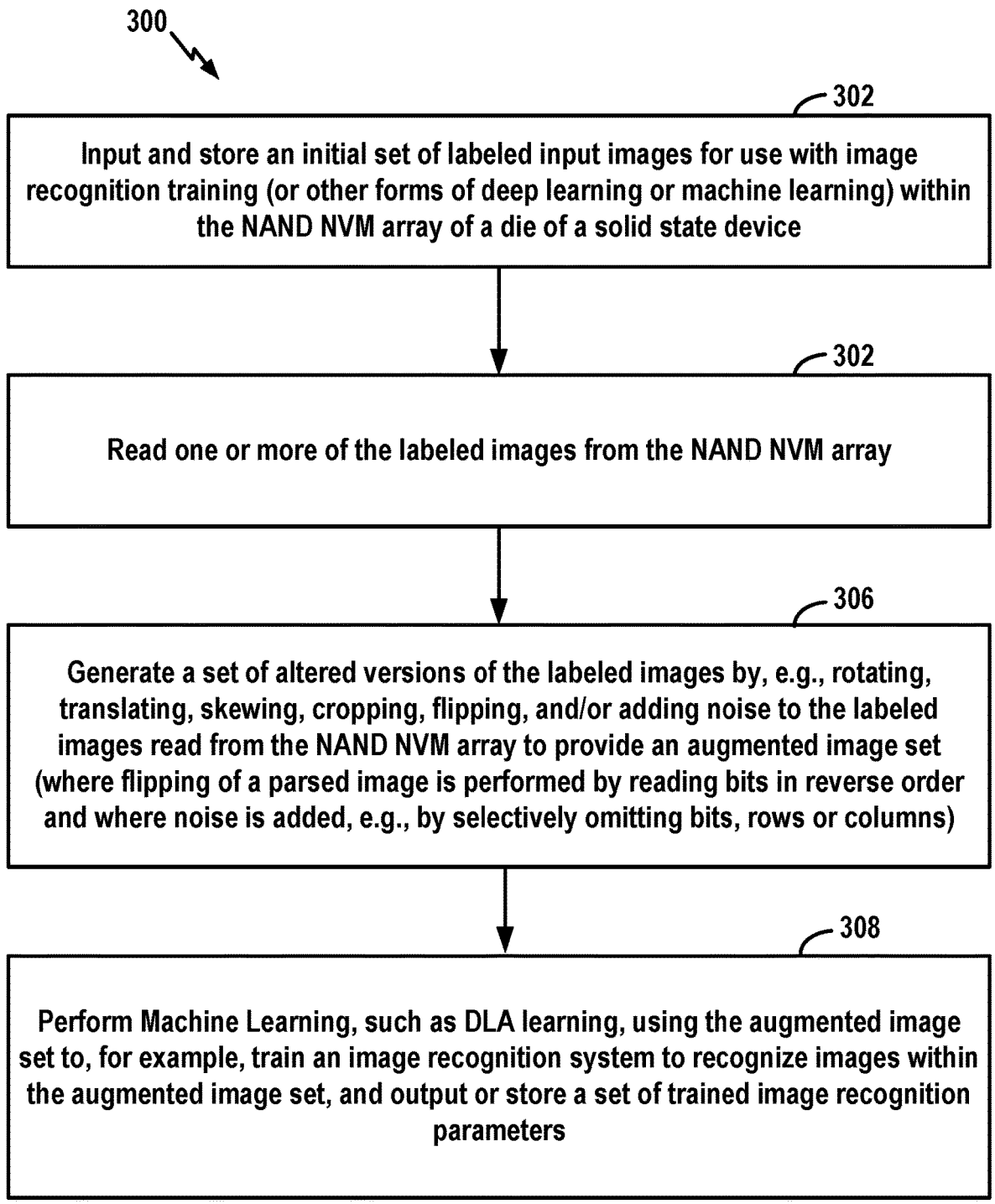
FIG. 3 illustrates a flow chart of an exemplary method according to aspects of the present disclosure for performing various types of on-chip data augmentation of image data.

FIG. 3 illustrates an exemplary method 300 for data augmentation for use with image recognition according to aspects of the present disclosure where any of the aforementioned forms of data augmentation may be applied (e.g. skewing, rotating, etc.). Beginning at block 302, input circuitry of an NVM die inputs an initial set of labeled (or tagged) input images for use with image recognition training (or for use with other forms of deep learning or machine learning) and stores the initial set of images within a NAND NVM array of the die. At 304, read circuitry of the NVM die reads one or more of the labeled images from the NAND NVM array. At 306, data augmentation circuitry of the NVM die generates a set of altered versions of the labeled images by, e.g., rotating, translating, skewing, cropping, flipping, and/or adding noise to the labeled images read from the NAND NVM array to provide an augmented image set. At 308, machine learning circuitry of the NVM die performs machine learning, such as DLA learning, using the augmented image set to, for example, train an image recognition system to recognize images within the augmented image set, and then output a set of trained parameters. In some examples, the parameters may include synaptic weights, bias values, etc., for use with a DNN configured for image recognition. The image recognition system itself may be configured, e.g., within the extra-array circuitry of the die or may be embodied elsewhere, such as within an SSD controller, a host system, or a remote server.

Insofar as flipping is concerned, when using a DLA, images often need to be stored in a parsed format (rather than a compressed format like JPEG). With parsed images, flipping of an image can be achieved by reversing the order of read pixels. Flipping on a different axis may be performed by the die if the size and parameters of the image are stored in the NAND memory (as would often be the case with an on-chip DLA) and hence the parameters are available to the die logic circuitry for use in flipping. Note also that noise can be added to an image by omitting every other bit of the image or every other row or column of the image, or by performing other relatively straight-forward adjustments to an image to generate a "noisy" version of the image.

Figure 4:
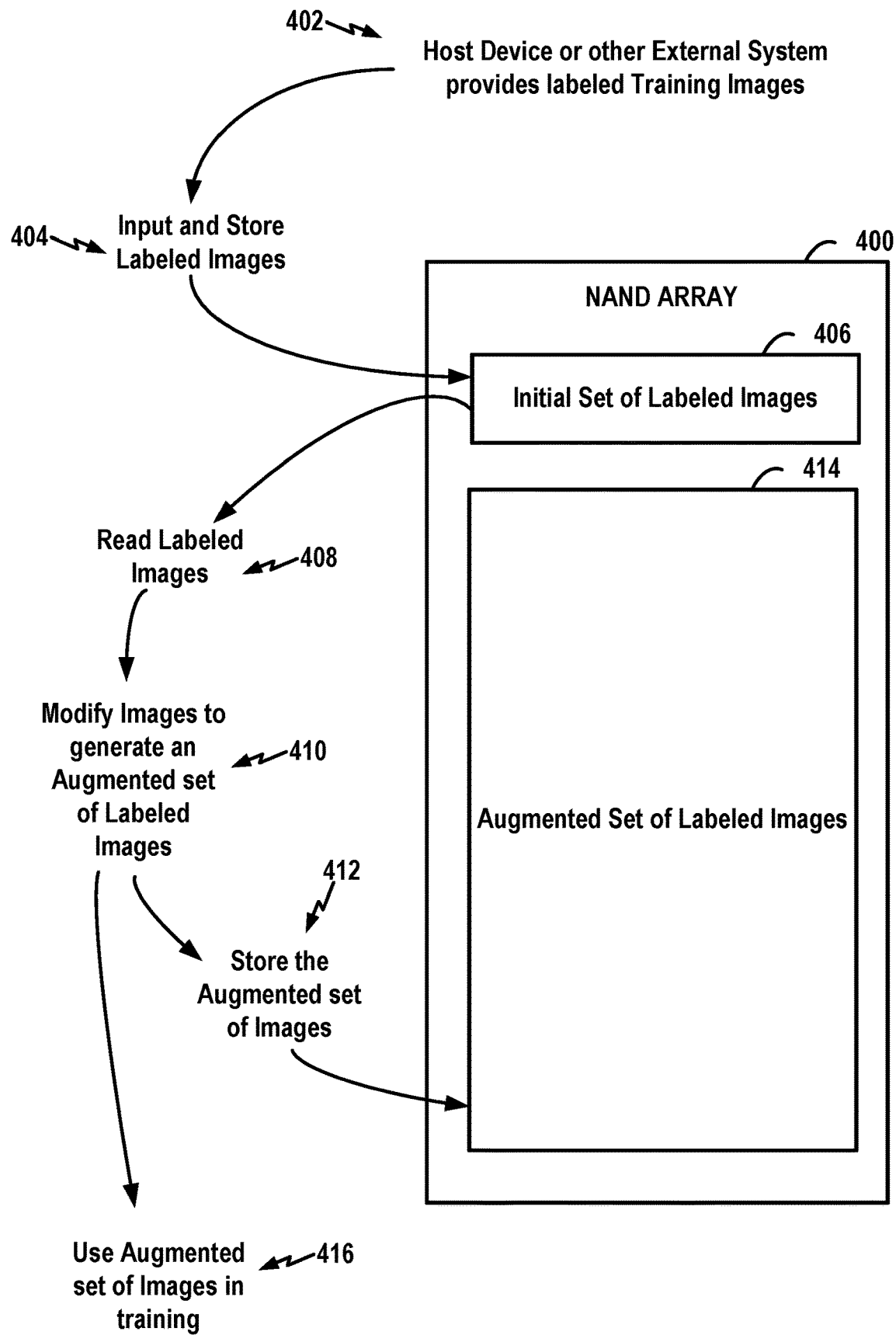
FIG. 4 illustrates a NAND array of an NVM die for storing image data and also schematically illustrating the various on-chip data augmentation procedures of FIG. 3.

FIG. 4 illustrates a NAND array 400 of an NVM die (such as the die of FIG. 2) for storing image data and various procedures that manipulate and process the data using the methods of FIG. 3. At 402, a host device or other external system provides labeled training images, such as labeled images of particular individuals to be identified by an image recognition system or particular types of objects or animals to be detected. At 404, circuitry of the NVM die inputs and stores the labeled images within a first portion or first region 406 of the NAND array 400. Later, when a data augmentation procedure is initiated, circuitry of the NAND die reads the labeled images at 408, modifies the images to generate an augmented set of labeled images at 410, and then stores the augmented set of images at 412 into a second region or second portion 414 of the NAND array 400 for subsequent use in training an image recognition system, such as for training the DLA of an on-chip image recognition system. Additionally or alternatively, at 416, the circuitry of the NAND die uses the augmented set of images (substantially) immediately to train an image recognition system, such as by directly applying the augmented set of images to an on-chip DLA.

Figure 5:
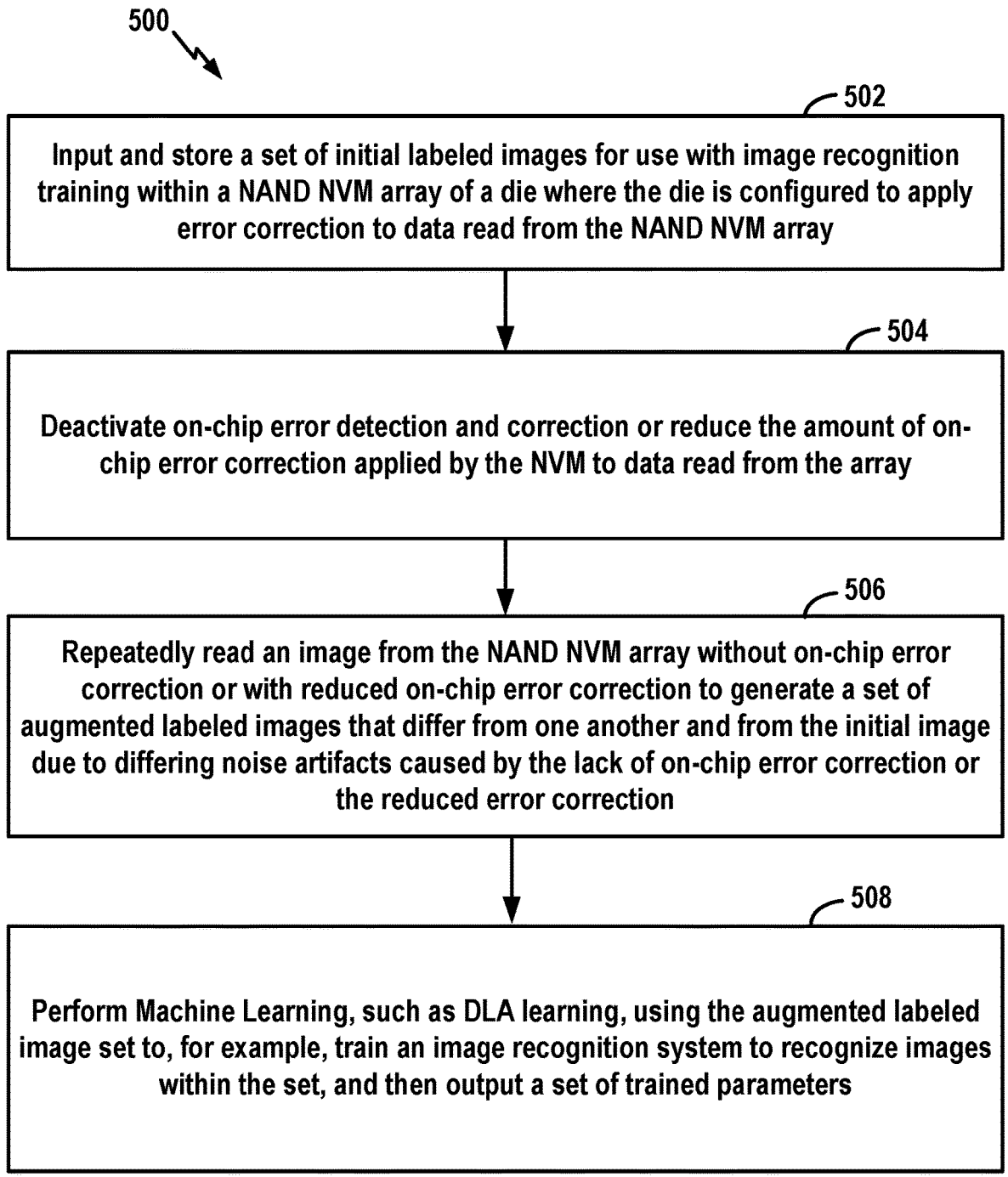
FIG. 5 illustrates a flow chart of an exemplary method according to aspects of the present disclosure for performing on-chip data augmentation of image data by deactivating or at least reducing the use of on-chip error correction procedures so as to obtain noisy images.

FIG. 5 illustrates an exemplary method 500 for data augmentation for use with image recognition according to aspects of the present disclosure where data augmentation is performed by deactivating or at least reducing the use of on-chip ECC (or other on-chip error correction systems or procedures). Note that, herein, deactivating ECC is one example of reducing the use of ECC. Beginning at block 502, input circuitry of the NVM die inputs an initial set of labeled input images for use with image recognition training (or other forms of deep learning or machine learning) and stores the initial set of labeled input images within a NAND NVM array of the die, where the die is configured to apply on-chip error correction to data read from the NAND NVM array. At 504, control circuitry of the NVM die deactivates on-chip error detection and correction procedures or otherwise reduces the amount (or effectiveness) of on-chip error correction applied by the NVM to data read from the array to selectively increase the effective BER. By deactivating ECC, data is read "as is," i.e. without ECC-based decoding. This reduces latency and saves power while also yielding noisy images for data augmentation. At 506, read circuitry of the NVM die repeatedly reads an image from the NAND NVM array without on-chip error correction or with reduced on-chip error correction to generate a set of augmented labeled images that differ from one another and from the initial image due to differing noise artifacts caused by the lack of on-chip error correction or the reduced error correction. In this manner, inherent noise associated with the natural BER of the die can be exploited to generate an augmented data set having uncorrelated noise artifacts (e.g. different noise vectors). At 508, machine learning circuitry of the NVM die performs machine learning, such as DLA learning, using the augmented labeled image set to, e.g., train an image recognition system to recognize images within the set, and then output a set of trained parameters. The image recognition system may be configured, e.g., within the extra-array circuitry of the die or may be embodied elsewhere, such as within an SSD controller, a host system, or a remote server.

Figure 6:
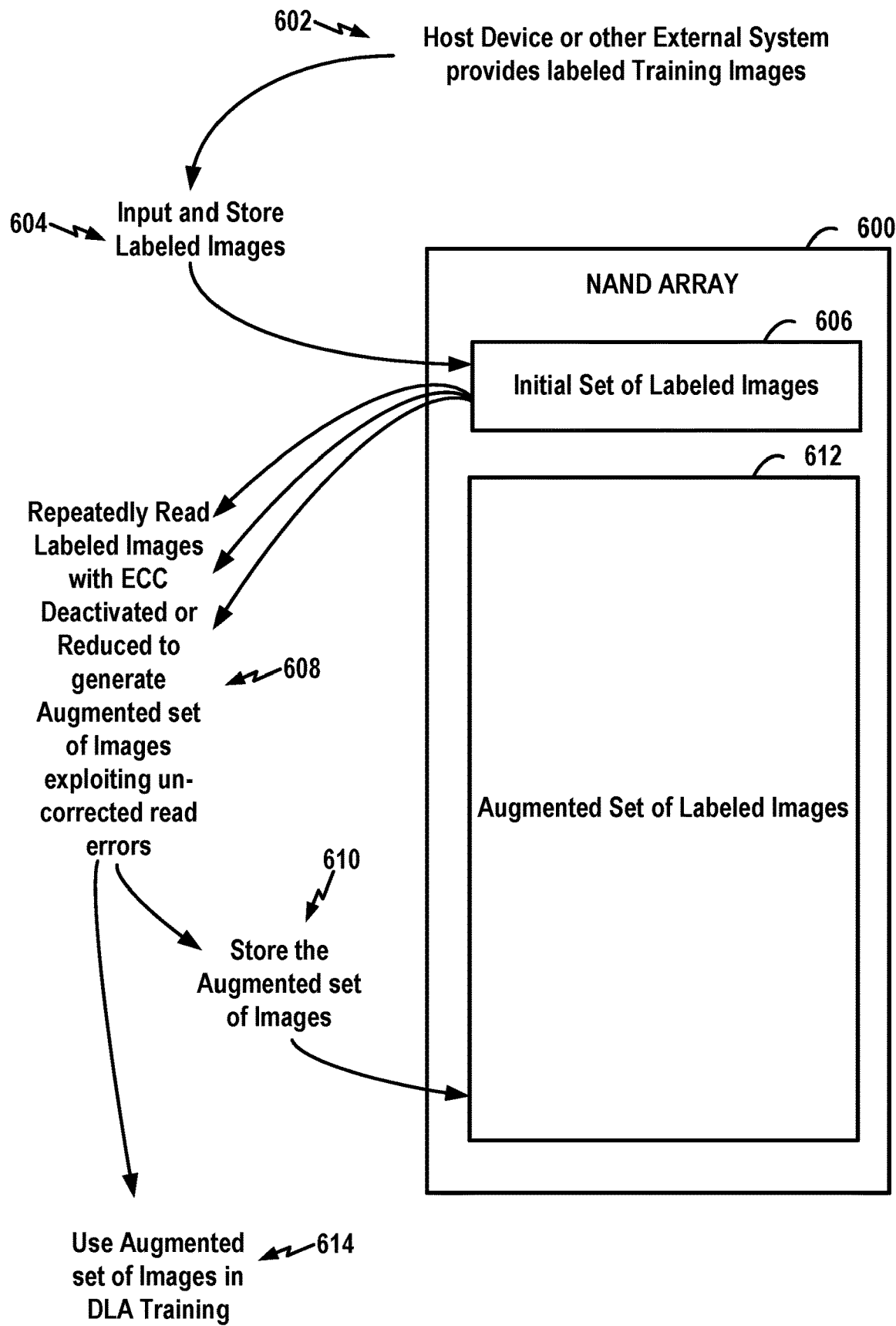
FIG. 6 illustrates a NAND array of an NVM die for storing image data and also schematically illustrating the error correction-based data augmentation procedures of FIG. 5.

FIG. 6 illustrates a NAND array 600 of an NVM die (such as the die of FIG. 2) for storing image data and various procedures that manipulate and process the data using the methods of FIG. 5. At 602, a host device or other external system provides labeled training images. At 604, circuitry of the NVM die inputs and stores the labeled images within a first portion or first region 606 of the NAND array 600. Later, when a data augmentation procedure is initiated, circuitry of the NAND die: repeatedly reads the labeled images at 608 with on-chip ECC deactivated or reduced so as to provide or retain noise within the read images and thus generate an augmented set of labeled images; and then stores the augmented set of images at 610 into a second region or second portion 612 of the NAND array 600 for subsequent use in training an image recognition system. Additionally or alternatively, at 614, the circuitry of the NAND die uses the augmented set of images (substantially) immediately to train an image recognition system.

In FIG. 6, multiple arrows are shown leading from the first array portion 606 to emphasize that individual images stored therein can be repeatedly read. Each separate read from the NAND array, performed either without on-chip ECC or with reduced on-chip ECC, will generally result in different noise artifacts in the read-out images, where the noise artifacts are uncorrelated within one another, thus providing noise-based data augmentation or noise-augmented data sets. The read operations may be performed repeatedly until a training system that uses the augmented data set is satisfied that a sufficient the number of samples of each particular image are collected, such as by comparing the number of sample against a suitable threshold value or by verifying that the system is sufficiently trained. In some examples, a read channel or NVM device controller that is separate from the NVM die (i.e. off-chip) may be configured to perform at least some of the procedures or operations of FIGS. 5 and 6, for example if ECC is performed by a device or component that is separate from the die.

Figure 7:
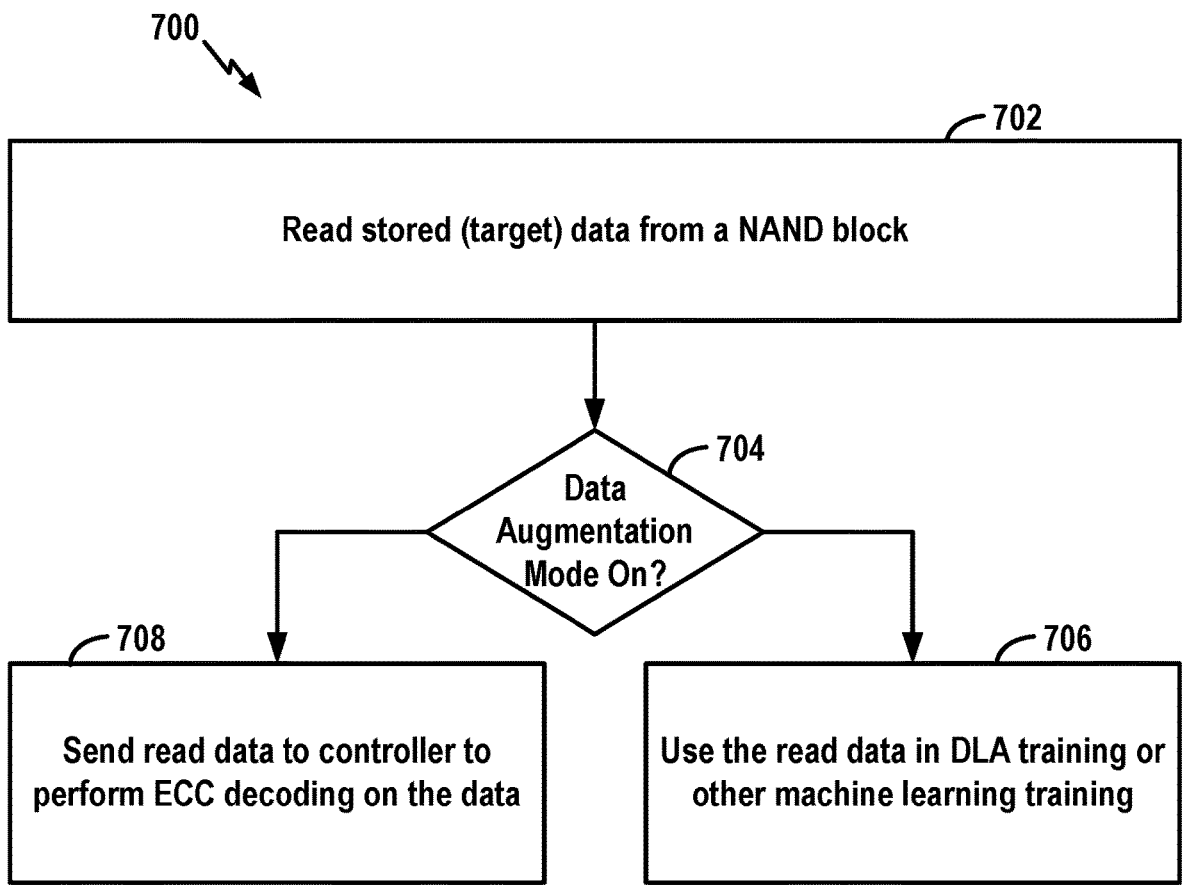
FIG. 7 illustrates a flow chart of an exemplary method according to aspects of the present disclosure for use in systems where error correction procedures are instead performed by a separate device controller.

As noted, in some systems, ECC is performed by a device controller that is separate from the NAND die (such as controller 108 of FIG. 1). FIG. 7 summarizes a method that may be performed by the die. Briefly, at block 702, the die reads stored (target) data from a NAND block (which might be image data for use in DLA training or might be other data). At decision block 704, the die determines whether a data augmentation mode is ON. If the data augmentation mode is ON, then at block 706, the die uses the read data in DLA training or other machine learning training. If data augmentation mode is OFF, the read data at block 708 is instead sent a controller (such as separate device controller 108 of FIG. 1 or a controller formed on the NAND) to perform ECC decoding on the data, so that the data can then be processed normally.

Figure 8:
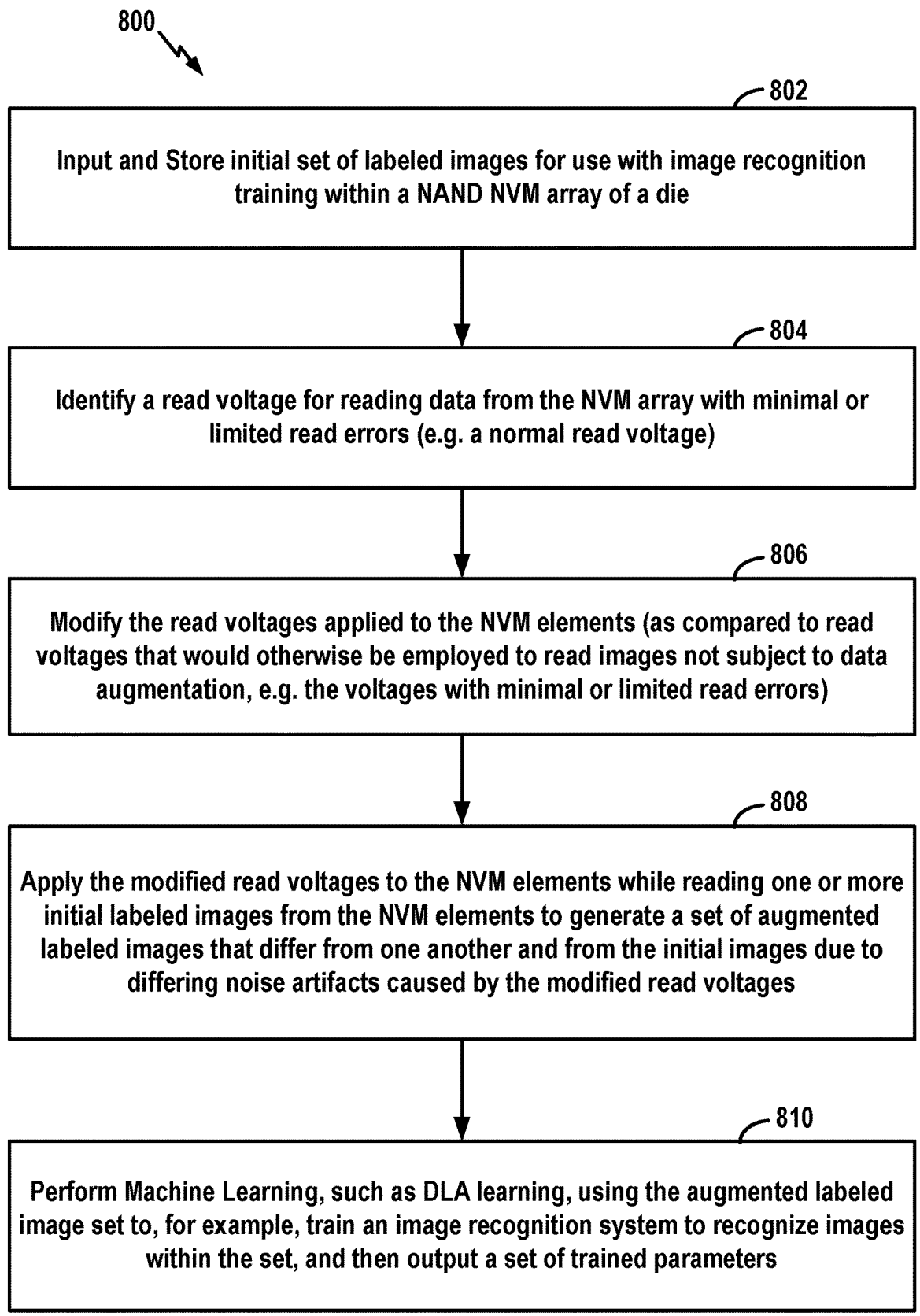
FIG. 8 illustrates a flow chart of an exemplary method according to aspects of the present disclosure for performing on-chip data augmentation of images by adjusting read voltages during data reads so as to obtain noisy images.

FIG. 8 illustrates an exemplary method 800 for data augmentation for use with image recognition according to aspects of the present disclosure where data augmentation is performed by modifying read voltages to inject noise into read images (or otherwise obtain a greater amount of read errors). Beginning at block 802, input circuitry of the NVM die inputs an initial set of labeled input images for use with image recognition training (or other forms of deep learning or machine learning) and stores the initial set of labeled input images within a NAND NVM array of the die. At block 804, control circuitry of the NVM die identifies a read voltage for reading data from the NVM array with minimal read errors (e.g. a normal read voltage set to achieve a low BER). At block 806, the control circuitry of the NVM die modifies the read voltages applied to its NVM elements (as compared to read voltages that would otherwise be employed to read images not subject to data augmentation, e.g. the voltages with minimal read errors identified at block 804). And so, in one example, if data is ordinarily read using an average threshold voltage of X volts, the modified read voltage might be 0.9× volts. At block 808, read circuitry of the NVM die applies the modified read voltages to the NVM elements while reading one or more of the initial labeled images from the NVM elements to generate a set of augmented labeled images that differ from one another and from the initial images due to differing noise artifacts caused by the modified read voltages. At 810, machine learning circuitry of the NVM die performs machine learning, such as DLA learning, using the augmented labeled image set to, e.g., train an image recognition system to recognize images within the set, and then output a set of trained parameters.

Figure 9:
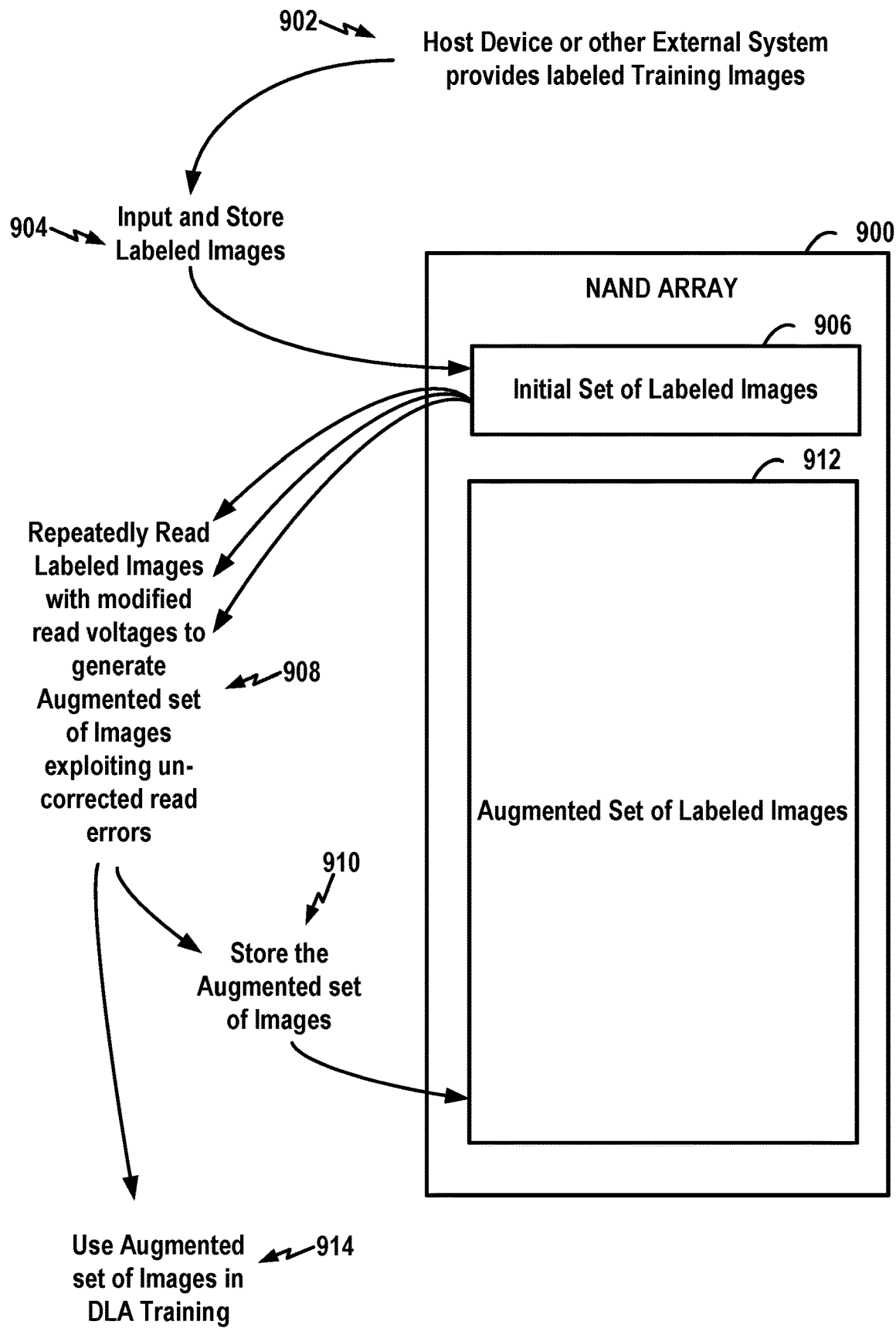
FIG. 9 illustrates a NAND array of an NVM die for storing image data and also schematically illustrating the read voltage-based data augmentation procedures of FIG. 8.

FIG. 9 illustrates a NAND array 900 of an NVM die (such as the die of FIG. 2) for storing image data and various procedures that manipulate and process the data using the methods of FIG. 8. At 902, a host device or other external system provides labeled training images. At 904, circuitry of the NVM die inputs and stores the labeled images within a first portion or first region 906 of the NAND array 900. Later, when a data augmentation procedure is initiated, circuitry of the NAND die: repeatedly reads the labeled images at 908 with the modified read voltages so as to provide or retain noise within the read images to thereby generate an augmented set of labeled images; and then stores the augmented set of images into a second region or second portion 912 of the NAND array 900 for subsequent use in training an image recognition system. Additionally or alternatively, at 914, the circuitry of the NAND die uses the augmented set of images (substantially) immediately to train an image recognition system. In FIG. 9, multiple arrows are shown leading from the first array portion 906 to emphasize that individual images stored therein can be repeatedly read with potentially different read voltages. Each separate read from the NAND array will generally result in different noise artifacts, where the noise artifacts are uncorrelated within one another, thus providing noise-based data augmentation or noise-augmented data sets.

Figure 10:
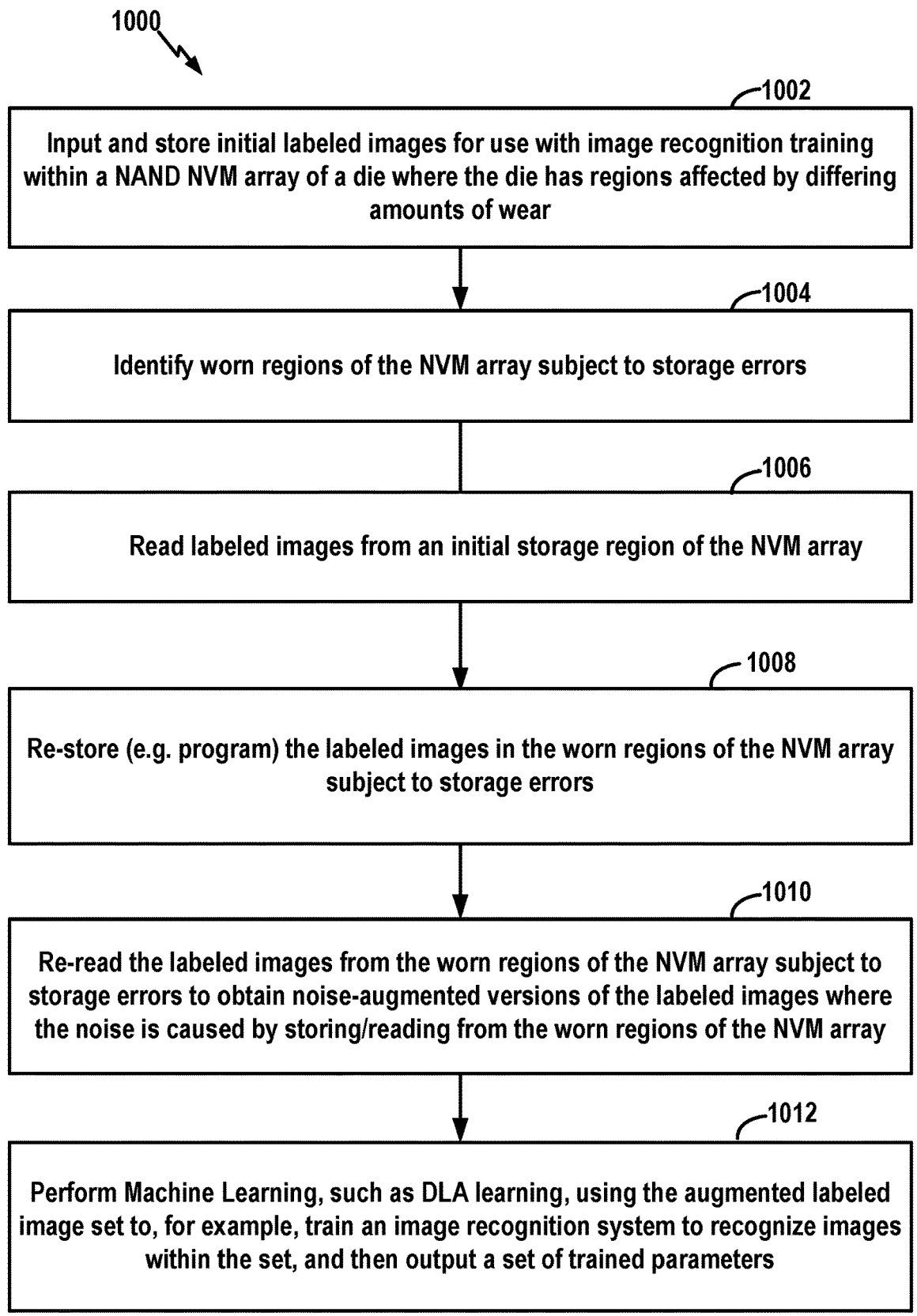
FIG. 10 illustrates a flow chart of an exemplary method according to aspects of the present disclosure for performing on-chip data augmentation of images by storing and then reading image data within worn regions of the NVM die so as to obtain noisy images.

FIG. 10 illustrates an exemplary method 1000 for data augmentation for use with image recognition according to aspects of the present disclosure where data augmentation is performed by repeatedly writing (initially un-augmented) data to worn regions of the NVM and then reading the data from the worn regions of the NVM to thereby inject noise into the images. Beginning at block 1002, input circuitry of the NVM die inputs an initial set of labeled input images for use with image recognition training (or other forms of deep learning or machine learning) and stores the initial set of labeled input images within a NAND NVM array of the die, where the die has regions affected by differing amounts of wear. At 1004, control circuitry of the NVM die identifies worn regions of the NVM array that are subject to storage errors. Any suitable technique can be used to identify worn areas of the NVM array, such as by tracking the BER of data read from various blocks. At block 1006, read circuitry of the NVM die reads labeled images from an initial storage region of the NVM array and, at block 1008, write (program) circuitry of the NVM die re-stores the labeled images in the worn regions of the NVM subject to storage errors. At block 1010, read circuitry of the NVM die re-reads the labeled images from the worn regions of the NVM array to thereby obtain noise-augmented versions of the labeled images where the noise is caused by storing/reading from the worn regions of the NVM array that have high BER. At 1012, machine learning circuitry of the NVM die performs machine learning, such as DLA learning, using the augmented labeled image set to, e.g., train an image recognition system to recognize images, and then output a set of trained parameters.

Figure 11:
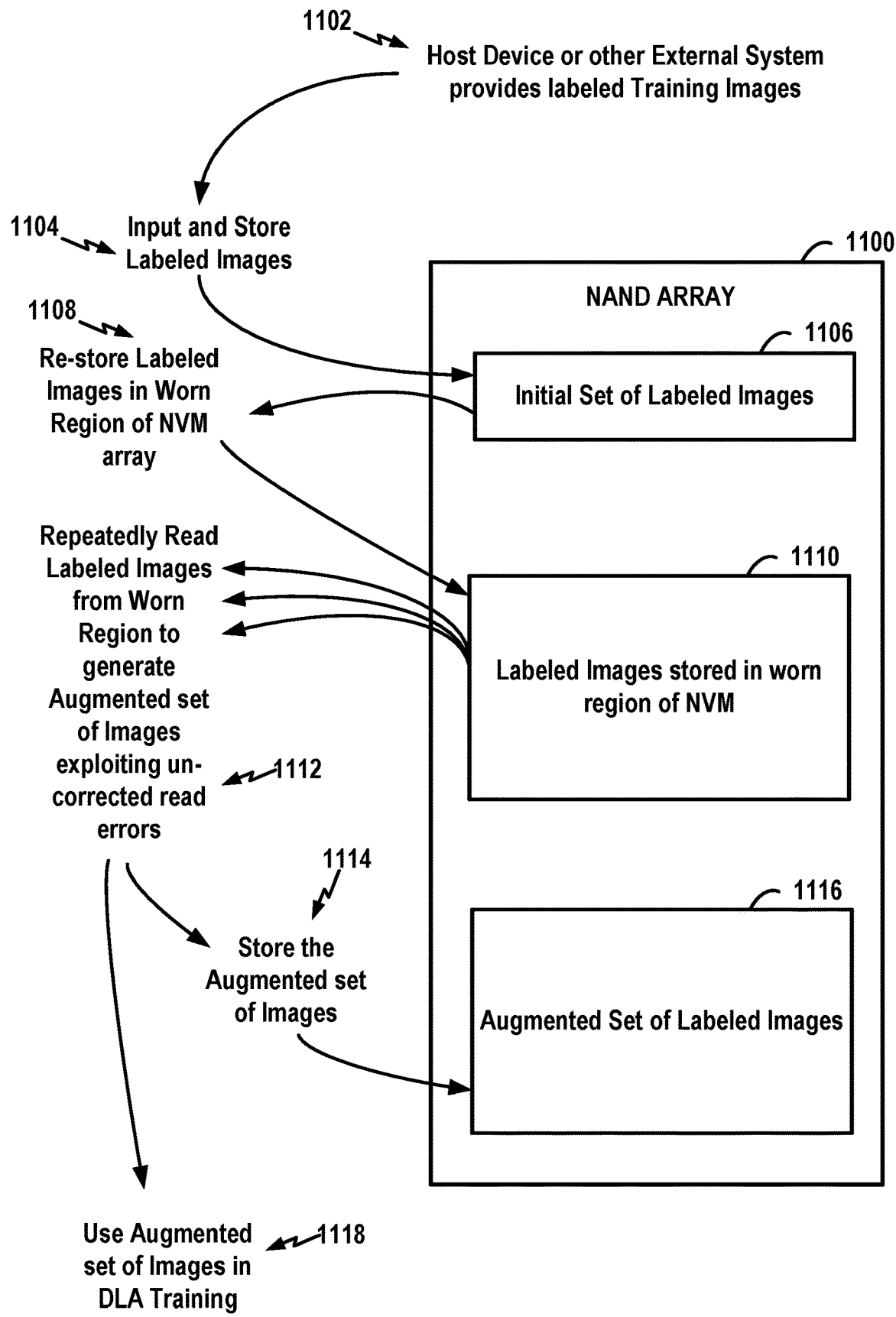
FIG. 11 illustrates a NAND array of an NVM die for storing image data and also schematically illustrating the worn region-based data augmentation procedures of FIG. 10.

FIG. 11 illustrates a NAND array 1100 of an NVM die (such as the die of FIG. 2) for storing image data and various procedures that manipulate and process the data using the methods of FIG. 10. At 1102, a host device or other external system provides labeled training images. At 1104, circuitry of the NVM die inputs and stores the labeled images within a first (non-worn) region 1106 of the NAND array 1100. Later, at 1108, when a data augmentation procedure is initiated, circuitry of the NVM die re-stores the labeled images in a worn region 1110 of the NAND array. At 1112, read circuitry of the NVM die repeatedly reads the labeled images from the worn region 1110 so as to thereby generate an augmented set of labeled images exploiting un-corrected read errors. At 1114, circuitry of the NVM die stores the augmented set of images into another region 1116 of the NAND array 1100 for subsequent use in training an image recognition system. Additionally or alternatively, at 1118, the circuitry of the NAND die uses the augmented set of images (substantially) immediately to train an image recognition system. In FIG. 11, multiple arrows are shown leading from worn array portion 1110 to emphasize that individual images stored therein can be repeatedly read. Each separate read from the NAND array will generally result in different noise artifacts due to the worn characteristics of the array region 1110, where the noise artifacts are uncorrelated within one another, thus providing for noise-augmented data sets.

In the following, various general exemplary procedures and systems are described.

Additional Exemplary Methods and Apparatus

Figure 12:
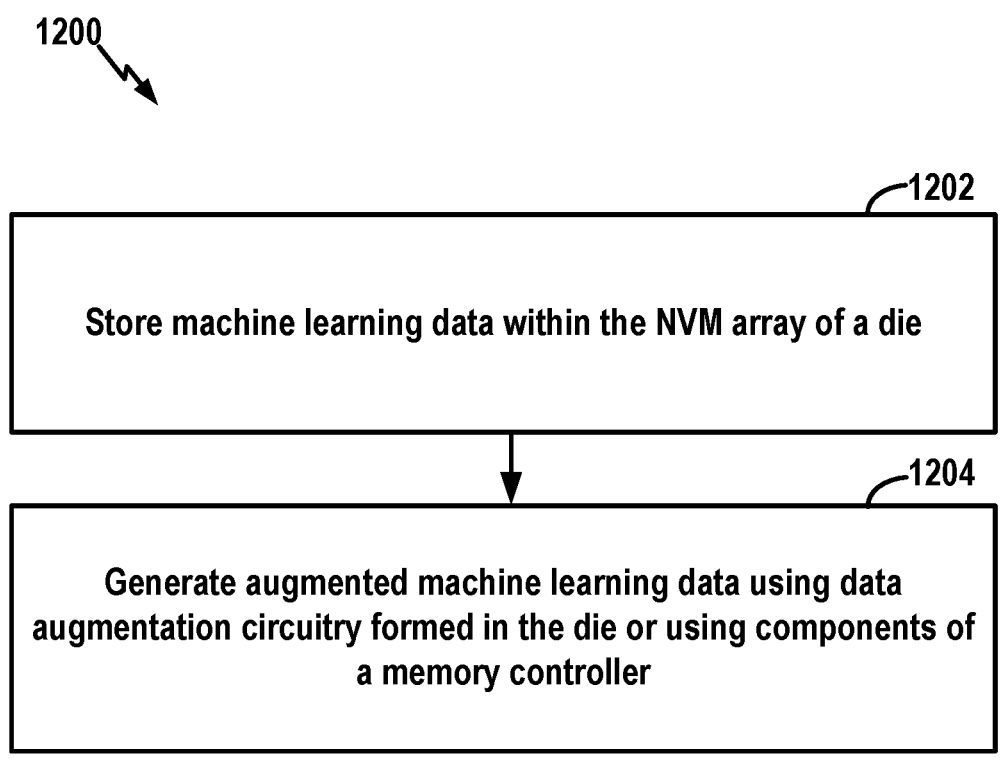
FIG. 12 illustrates a flow chart that summarizes exemplary on-chip data augmentation operations performed by an NVM die.

FIG. 12 broadly illustrates a process 1200 in accordance with some aspects of the disclosure. The process 1200 may take place within any suitable apparatus or device having a die capable of performing the operations, such as a NAND die. At block 1202, the die (e.g. a suitably-configured NAND die) stores machine learning data within the NVM array of a die. At block 1204, the die generates augmented machine learning data using data augmentation circuitry formed in the die or using components of a memory controller. Examples are described above. Insofar as using components of a memory controller is concerned, by way of example, ECC components of the memory controller may be configured or controlled to permit or facilitate the creation of augmented data sets by deactivating or reducing ECC.

Figure 13:
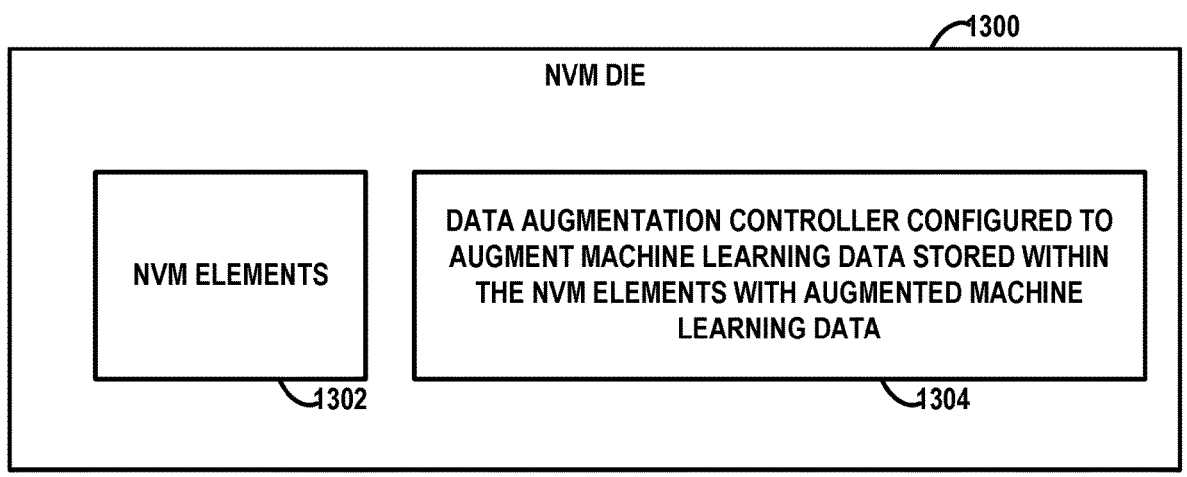
FIG. 13 illustrates a schematic block diagram configuration for an exemplary NVM apparatus such as a NAND die.

FIG. 13 broadly illustrates an embodiment of an apparatus 1300 configured according to one or more aspects of the disclosure. The apparatus 1300, or components thereof, could embody or be implemented within a NAND die or some other type of NVM device that supports data storage. The apparatus 1300 includes NVM elements 1302 and a data augmentation controller 1304 configured to augment machine learning data stored within the NVM elements 1302 with augmented machine learning data. Examples of the apparatus are described above. Additional examples are described below. As noted, at least some data augmentation components may be separate from the die, such as ECC components of a NAND device controller.

Figure 14:
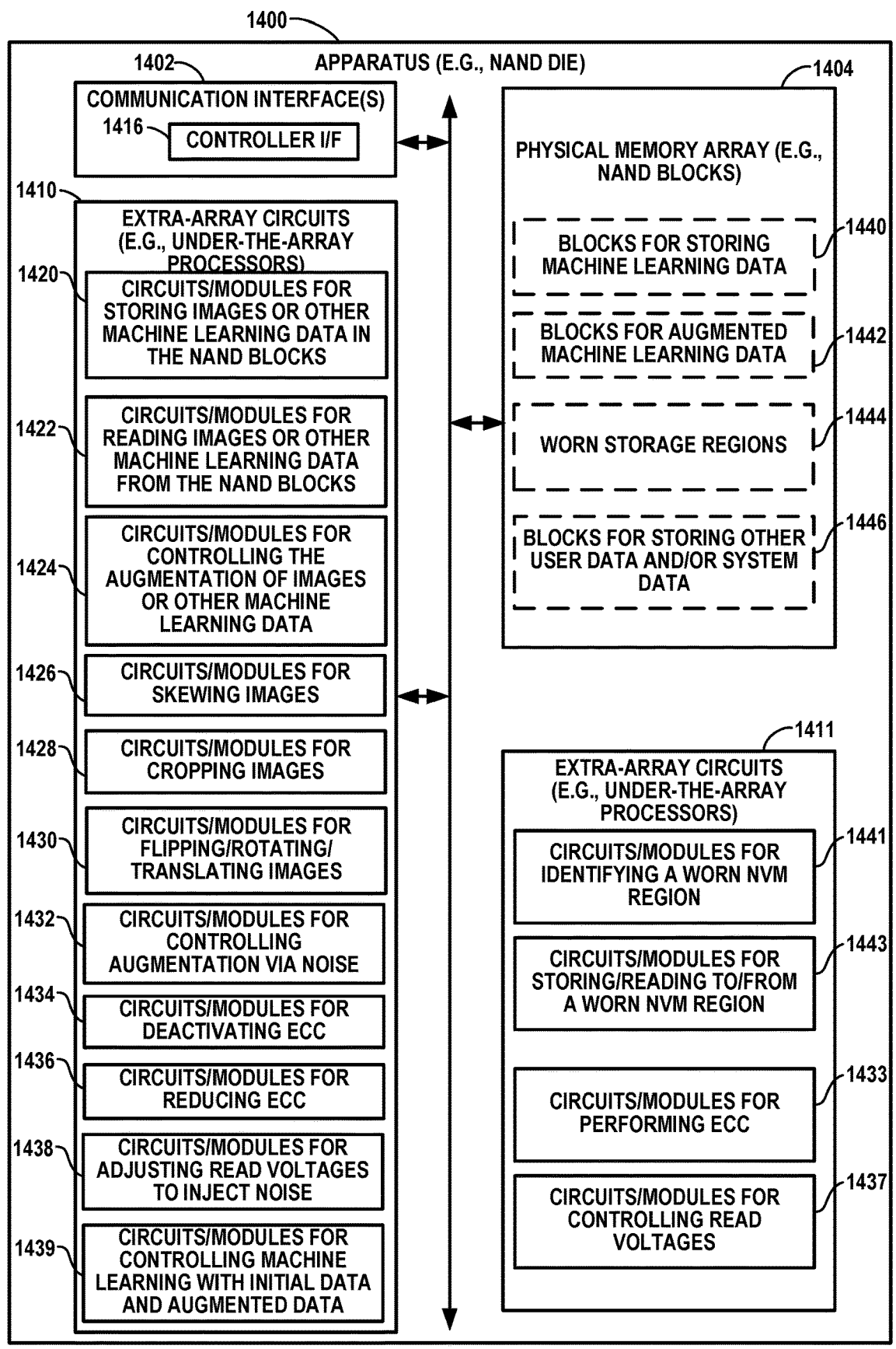
FIG. 14 illustrates a schematic block diagram providing further details of an exemplary NVM die and its on-chip components.

FIG. 14 illustrates an embodiment of an apparatus 1400 configured according to one or more aspects of the disclosure. The apparatus 1400, or components thereof, could embody or be implemented within a NAND die or some other type of NVM device that supports data storage. In various implementations, the apparatus 1400, or components thereof, could be a component of a processor, a controller, a computing device, a personal computer, a portable device, or workstation, a server, a personal digital assistant, a digital camera, a digital phone, an entertainment device, a medical device, a self-driving vehicle control device, or any other electronic device that stores, processes or uses neural data.

The apparatus 1400 includes a communication interface 1402, a physical memory array (e.g., NAND blocks) 1404, and extra-array processing circuits 1410, 1411 (e.g. under-the-array or next-to-the-array circuits). These components can be coupled to and/or placed in electrical communication with one another via suitable components, represented generally by the connection lines in FIG. 14. Although not shown, other circuits such as timing sources, peripherals, voltage regulators, and power management circuits may be provided, which are well known in the art, and therefore, will not be described any further.

The communication interface 1402 provides a means for communicating with other apparatuses over a transmission medium. In some implementations, the communication interface 1402 includes circuitry and/or programming (e.g., a program) adapted to facilitate the communication of information bi-directionally with respect to one or more devices in a system. In some implementations, the communication interface 1402 may be configured for wire-based communication. For example, the communication interface 1402 could be a bus interface, a send/receive interface, or some other type of signal interface including circuitry for outputting and/or obtaining signals (e.g., outputting signal from and/or receiving signals into an SSD). The communication interface 1402 serves as one example of a means for receiving and/or a means for transmitting.

The physical memory array 1404 may represent one or more NAND blocks. The physical memory array 1404 may be used for storing data such images that are manipulated by the circuits 1410, 1411 or some other component of the apparatus 1400. The physical memory array 1404 may be coupled to the circuits 1410, 1411 such that the circuits 1410, 1411 can read or sense information from, and write or program information to, the physical memory array 1404. That is, the physical memory array 1404 can be coupled to the circuits 1410, 1411 so that the physical memory array 1404 is accessible by the circuits 1410, 1411.

The circuits 1410, 1411 are arranged or configured to obtain, process and/or send data, control data access and storage, issue or respond to commands, and control other desired operations. For example, the circuits 1410, 1411 may be implemented as one or more processors, one or more controllers, and/or other structures configured to perform functions. According to one or more aspects of the disclosure, the circuits 1410, 1411 may be adapted to perform any or all of the extra-array features, processes, functions, operations and/or routines described herein. For example, the circuits 1410 may be configured to perform any of the steps, functions, and/or processes described with respect to FIGS. 2-13. As used herein, the term "adapted" in relation to the processing circuits 1410, 1411 may refer to the circuits being one or more of configured, employed, implemented, and/or programmed to perform a particular process, function, operation and/or routine according to various features described herein. The circuits may include a specialized processor, such as an application specific integrated circuit (ASIC) that serves as a means for (e.g., structure for) carrying out any one of the operations described in conjunction with FIGS. 2-13. The circuits serve as an example of a means for processing. In various implementations, the circuits may provide and/or incorporate, at least in part, functionality described above for the components 204 of FIG. 2.

According to at least one example of the apparatus 1400, the processing circuit 1410, 1411 may include one or more of: circuit/modules 1420 configured for storing images or other machine learning data in the NAND blocks; circuits/modules 1422 configured for reading images or other machine learning data from the NAND blocks; circuits/modules 1424 configured for controlling the augmentation of images or other machine learning data; circuits/modules 1426 configured for skewing images; circuits/modules 1428 configured for cropping images; circuits/modules 1430 configured for flipping/rotating/translating images; circuits/modules 1432 configured for controlling augmentation via noise; circuits/modules 1433 configured for performing ECC; circuits/modules 1434 configured for deactivating ECC; circuits/modules 1436 configured for reducing ECC; circuits/modules 1437 configured for controlling read voltages; circuits/modules 1438 configured for adjusting read voltages to inject noise; circuits/modules 1439 configured for controlling machine learning with initial data and augmented data; circuits/modules 1441 configured for identifying a worn NVM region; and circuits/modules 1443 configured for storing data to and/or reading data from a worn NVM region storage/read component.

As shown in FIG. 14, the physical memory array 1404 may include one or more of: blocks 1440 for storing machine learning data, such as input labeled images; blocks 1442 for storing augmented versions of the machine learning data; blocks 1444 that are worn regions; and blocks 1446 for storing other user data or system data (e.g. data pertaining to the overall control of operations of the NAND die).

In at least some examples, means may be provided for performing the functions illustrated in FIG. 14 and/or other functions illustrated or described herein. For example, the means may include one or more of: means, such as circuit/module 1420, for storing images or other machine learning data in the NAND blocks; means, such as circuits/modules 1422, for reading images or other machine learning data from the NAND blocks; means, such as circuits/modules 1424, for controlling the augmentation of images or other machine learning data; means, such as circuits/modules 1426, for skewing images; means, such as circuits/modules 1428, for cropping images; means, such as circuits/modules 1430, for flipping/rotating/translating images; means, such as circuits/modules 1432, for controlling augmentation via noise; means, such as circuits/modules 1433, for performing ECC; means, such as circuits/modules 1434, for deactivating ECC; means, such as circuits/modules 1436, for reducing ECC; means, such as circuits/modules 1437, for controlling read voltages; means, such as circuits/modules 1438, for adjusting read voltages to inject noise; means, such as circuits/modules 1439, for controlling machine learning with initial data and augmented data; means, such as circuits/modules 1441, for identifying a worn NVM region; means, such as circuits/modules 1443, for storing data to and/or reading data from a worn NVM region storage/read component; means, such as NAND blocks 1440, for storing machine learning data; means, such as NAND blocks 1442, for storing augmented versions of the machine learning data; and means, such as NAND blocks 1446, for storing other user data or system data (e.g. data pertaining to the overall control of operations of the NAND die).

In other examples, means, such as NVM elements 1202 of FIG. 2 that are formed in a die, are provided for storing machine learning data within the NVM array of the die; and means, such as data augmentation controller 204 of FIG. 2 that are also formed in the die, are provided for generating at least one augmented version of the machine learning data.

Additional Aspects

At least some of the processing circuits described herein may be generally adapted for processing, including the execution of programming code stored on a storage medium. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

At least some of the processing circuits described herein may be arranged to obtain, process and/or send data, control data access and storage, issue commands, and control other desired operations. The processing circuits may include circuitry configured to implement desired programming provided by appropriate media in at least one example. For example, the processing circuits may be implemented as one or more processors, one or more controllers, and/or other structure configured to execute executable programming. Examples of processing circuits may include a general purpose processor, a digital signal processor (DSP), an ASIC, a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. At least some of the processing circuits may also be implemented as a combination of computing components, such as a combination of a controller and a microprocessor, a number of microprocessors, one or more microprocessors in conjunction with an ASIC and a microprocessor, or any other number of varying configurations. The various examples of processing circuits noted herein are for illustration and other suitable configurations within the scope of the disclosure are also contemplated.

Aspects of the subject matter described herein can be implemented in any suitable NAND flash memory, such as 3D NAND flash memory. Semiconductor memory devices include volatile memory devices, such as DRAM or SRAM devices, NVM devices, such as ReRAM, EEPROM, flash memory (which can also be considered a subset of EEPROM), ferroelectric random access memory (FRAM), and MRAM, and other semiconductor elements capable of storing information. Each type of memory device may have different configurations. For example, flash memory devices may be configured in a NAND or a NOR configuration. As noted, some features described herein are specific to NAND-based devices, such as the NAND-based on-chip copy with update.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon. The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory elements in each column. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements. One of skill in the art will recognize that the subject matter described herein is not limited to the two dimensional and three dimensional exemplary structures described but cover all relevant memory structures within the spirit and scope of the subject matter as described herein and as understood by one of skill in the art.

The examples set forth herein are provided to illustrate certain concepts of the disclosure. The apparatus, devices, or components illustrated above may be configured to perform one or more of the methods, features, or steps described herein. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

Aspects of the present disclosure have been described above with reference to schematic flowchart diagrams and/ or schematic block diagrams of methods, apparatus, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

The subject matter described herein may be implemented in hardware, software, firmware, or any combination thereof. As such, the terms "function," "module," and the like as used herein may refer to hardware, which may also include software and/or firmware components, for implementing the feature being described. In one example implementation, the subject matter described herein may be implemented using a computer readable medium having stored thereon computer executable instructions that when executed by a computer (e.g., a processor) control the computer to perform the functionality described herein. Examples of computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

While the above descriptions contain many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents. Moreover, reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise.

The terminology used herein is for the purpose of describing particular aspects only and is not intended to be limiting of the aspects. As used herein, the singular forms "a," "an" and "the" are intended to include the plural forms as well (i.e., one or more), unless the context clearly indicates otherwise. An enumerated listing of items does not imply that any or all of the items are mutually exclusive and/or mutually inclusive, unless expressly specified otherwise. It will be further understood that the terms "comprises," "comprising," "includes" "including," "having," an variations thereof when used herein mean "including but not limited to" unless expressly specified otherwise. That is, these terms may specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "I" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may include one or more elements. In addition, terminology of the form "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As a further example, "at least one of: A, B, or C" is intended to cover A, B, C, A-B, A-C, B-C, and A-B-C, as well as multiples of the same members (e.g., any lists that include AA, BB, or CC) Likewise, "at least one of: A, B, and C" is intended to cover A, B, C, A-B, A-C, B-C, and A-B-C, as well as multiples of the same members. Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

What is claimed is:

1. An apparatus comprising:
    a die with non-volatile memory (NVM) elements;
    a data augmentation controller formed in the die and configured to augment machine learning image data stored within the NVM elements with augmented machine learning image data by adding noise to one or more initial images obtained from the NVM elements to generate one or more altered images; and
    a deep learning accelerator formed in the die and configured to process the one or more initial images and the one or more altered images to train a deep neural network (DNN) of an image recognition system to recognize at least one additional image, the deep learning accelerator further configured to output synaptic weights corresponding to the DNN;
    read components configured to apply read voltages to the NVM elements to read data from the NVM elements, and
    wherein the data augmentation controller is further configured to generate augmented data by modifying the read voltages to retain a greater amount of read errors as compared to an amount of read errors that would otherwise occur when reading data not subject to data augmentation, and then applying modified read voltages to the NVM elements while reading stored data from the NVM elements.

2. The apparatus of claim 1, wherein the data augmentation controller is further configured to generate one or more additional altered images by applying one or more of rotation, translation, skew, cropping, and flipping to the one or more initial images obtained from the NVM elements.

3. The apparatus of claim 1,
    wherein the apparatus further comprises error correction components configured to correct errors in data read from the NVM elements, and
    wherein the data augmentation controller is further configured to generate augmented data by deactivating the error correction components and then reading stored data from the NVM elements without error correction.

4. The apparatus of claim 1,
wherein the apparatus further comprises error correction components configured to correct errors in data read from the NVM elements, and
wherein the data augmentation controller is further configured to generate augmented data by reducing an amount of error correction performed by the error correction components compared to an amount of error correction that would otherwise be employed to read data not subject to data augmentation, and then reading stored data from the NVM elements with the reduced error correction.

5. The apparatus of claim 1, wherein the data augmentation controller further comprises:
a worn NVM region identifier component configured to identify worn regions of the NVM elements that are subject to storage errors; and
a worn region storage component configured to store un-augmented versions of data in the worn regions of the NVM elements and then read the data from the worn regions of the NVM elements to obtain noise-augmented versions of the data.

6. The apparatus of claim 1, wherein the NVM elements comprise NAND flash storage elements.

7. The apparatus of claim 1, wherein the data augmentation controller formed in the die is further configured as one or more of an under-the-array component and a next-to-the-array component.

8. A method for use by a die that includes a non-volatile memory (NVM) array, the method comprising:
storing machine learning image data within the NVM array of the die;
generating augmented machine learning image data using data augmentation circuitry formed in the die by adding noise to one or more initial images obtained from the NVM elements to generate one or more altered images; and
processing the one or more initial images and the one or more altered images using a deep learning accelerator formed in the die that is configured to train a deep neural network (DNN) of an image recognition system to recognize at least one additional image, the deep learning accelerator further configured to output synaptic weights corresponding to the DNN;
modifying read voltages applied to the NVM elements to retain a greater amount of read errors as compared to an amount of read errors that would otherwise occur when reading data not subject to data augmentation; and
applying the modified read voltages to the NVM elements while reading machine learning data from the NVM elements.

9. The method of claim 8, wherein the one or more initial images comprise labeled images and the one or more altered images comprise labeled altered images that re-use the same labels used for correspond images of the one or more initial images.

10. The method of claim 8, wherein generating the augmented machine learning data further comprises:
generating one or more additional altered images by performing one or more of rotating, translating, skewing, cropping, and flipping to the one or more initial images.

11. The method of claim 8, wherein generating the augmented machine learning data further comprises:

reducing the use of error correction components that are configured to apply error correction to data read from the NVM array; and
reading machine learning data from the NVM array with reduced error correction.

12. The method of claim 8, wherein generating the augmented machine learning data further comprises:
identifying portions of the NVM array subject to storage errors;
reading machine learning data from a first portion of the NVM array;
storing the machine learning data in the portions of the NVM array subject to storage errors; and
reading the machine learning data from the portions of the NVM array subject to storage errors to obtain noise-augmented versions of the machine learning data.

13. An apparatus formed on a die that includes a non-volatile memory (NVM) array, the apparatus comprising:
means formed in the die for storing machine learning image data within the NVM array of the die;
means formed in the die for generating at least one augmented version of the machine learning image data by adding noise to one or more initial images obtained from the NVM elements to generate one or more altered images; and
means formed in the die for processing the one or more initial images and the one or more altered images using accelerated deep learning to train a deep neural network (DNN) of an image recognition system to recognize at least one additional image, the deep learning accelerator further configured to output synaptic weights corresponding to the DNN;
wherein the means formed in the die for storing machine learning image data comprises:
means for modifying read voltages applied to the NVM elements to retain a greater amount of read errors as compared to an amount of read errors that would otherwise occur when reading data not subject to data augmentation; and
means for applying the modified read voltages to the NVM elements while reading machine learning data from the NVM elements.

14. The apparatus of claim 13, wherein the means for generating at least one augmented version of the machine learning data further comprises means for generating additional augmented images by applying one or more of rotation, translation, skew, cropping, and flipping to the one or more initial images.

15. The apparatus of claim 1, wherein the data augmentation controller is further configured to add the noise by adding uncorrelated noise, the uncorrelated noise having different noise vectors.

16. The method of claim 8, wherein adding noise comprises adding uncorrelated noise, the uncorrelated noise having different noise vectors.

17. The apparatus of claim 1, wherein the DNN comprises multiple layers, each layer corresponding to a mathematical manipulation to convert an input value associated with an image being processed to an output value, the mathematical manipulation configured to determine a probability of the output value given the input value.

18. The method of claim 8, wherein the DNN comprises multiple layers, each layer corresponding to a mathematical manipulation to convert an input value associated with an image being processed to an output value, the mathematical manipulation configured to determine a probability of the output value given the input value.

\* \* \* \* \*